US006501318B1

(12) United States Patent
Randazzo et al.

(10) Patent No.: US 6,501,318 B1
(45) Date of Patent: Dec. 31, 2002

(54) HIGH SPEED INPUT BUFFER CIRCUIT

(75) Inventors: Todd A. Randazzo, Colorado Springs, CO (US); Brian E. Burdick, Colorado Springs, CO (US); Edson W. Porter, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/848,942

(22) Filed: May 4, 2001

(51) Int. Cl.[7] .................................................. H03K 5/08

(52) U.S. Cl. ........................ 327/309; 327/318; 327/324

(58) Field of Search ................................ 327/108, 112, 327/309, 310, 313, 324, 318–321, 327, 328, 379, 389, 427, 52, 65; 326/23, 26, 27, 83, 86, 87; 361/56, 90, 111, 91.1, 91.2, 91.5

(56) References Cited

U.S. PATENT DOCUMENTS 4,061,928 A * 12/1977 Kessler ........................ 361/56
4,527,213 A * 7/1985 Ariizumi et al. .............. 361/56
5,155,396 A * 10/1992 Maloberti et al. .......... 327/309
5,650,745 A * 7/1997 Merrill et al. .............. 327/379
5,732,015 A * 3/1998 Kazerounian et al. ...... 365/154
5,744,982 A * 4/1998 Chu ............................ 326/83
5,894,230 A * 4/1999 Voldman ...................... 326/83
6,025,737 A * 2/2000 Patel et al. .................... 326/86
6,055,191 A * 4/2000 Sher et al. ..................... 326/26
6,255,850 B1 * 7/2001 Turner ......................... 326/83

* cited by examiner

*Primary Examiner*—Terry D. Cunningham
*Assistant Examiner*—Long Nguyen
(74) *Attorney, Agent, or Firm*—Luedeka, Neely & Graham, P.C.

(57) ABSTRACT

A high speed input buffer of the type having a first connection in electrical communication with a positive voltage source and a second connection in electrical communication with a negative voltage source. A first native transistor is functionally disposed between the positive voltage source and the first connection. A first contact of the first native transistor is electrically connected to the positive voltage source and a second contact of the first native transistor is electrically connected to the first connection. A second native transistor is functionally disposed between the negative voltage source and the second connection. A first contact of the second native transistor is electrically connected to the negative voltage source and a second contact of the second native transistor is electrically connected to the second connection.

12 Claims, 3 Drawing Sheets

HIGH SPEED INPUT BUFFER CIRCUIT

FIELD

This invention relates to the field of integrated circuits. More particularly the invention relates to voltage tolerant high speed input circuits.

BACKGROUND

The input circuits of an integrated circuit are particularly susceptible to overvoltage conditions, because they are directly connected to devices that are external to the integrated circuit. Therefore, they may receive voltage spikes both during normal operation of the system of which they are a part, and when abnormal conditions are present. For example, when components within the system are powered up or powered down, voltage spikes may be generated along the buss that ties the various components together. The input buffers need to be resilient to these voltage spikes, in order to protect the rest of the circuits of the integrated circuit in which they reside.

Various input buffer designs have been developed to protect an integrated circuit from the damage that is created by overvoltage. However, these designs tend to impede the desired operation of the input circuit as a whole, in that the buffer tends to not propagate a signal with the speed that is required by modern electrical systems.

What is needed, therefore, is an input buffer design that protects an integrated circuit from overvoltage conditions, and does so without unduly compromising the speed of the input buffer.

SUMMARY

The above and other needs are met by an improvement in a high speed input buffer of the type having a first connection in electrical communication with a positive voltage source and a second connection in electrical communication with a negative voltage source. A first native transistor is functionally disposed between the positive voltage source and the first connection. A first contact of the first native transistor is electrically connected to the positive voltage source and a second contact of the first native transistor is electrically connected to the first connection. A second native transistor is functionally disposed between the negative voltage source and the second connection. A first contact of the second native transistor is electrically connected to the negative voltage source and a second contact of the second native transistor is electrically connected to the second connection.

Thus, the input buffer of the present invention avoids various problems associated with prior art devices by utilizing native pass gate transistors between the buffer circuit and the high and low voltage input pads. Using native pass gate transistors in this manner advantageously limits the voltage exposure of the input buffer to a value that is relatively close to, but preferably no more than the value of the supply voltage. The threshold voltage and the back bias coefficient of threshold voltage of the native pass gate transistors are preferably very low, such that the transistors are able to pass voltages all the way to the supply voltage.

In various preferred embodiments, one or both of the first native transistor and the second native transistor are native NMOS transistors. The high speed input buffer alternately includes at least one leakage element having a first electrical connection and a second electrical connection. The first electrical connection of the leakage element is electrically connected to the second contact of the first native transistor and the second electrical connection of the leakage element is electrically connected to a VSS line. Alternately or additionally, the first electrical connection of the leakage element is electrically connected to the second contact of the second native transistor and the second electrical connection of the leakage element is electrically connected to a VSS line. The leakage element or elements may be one or more of either a resistor or an NMOS transistor, where a gate contact of the NMOS transistor is also electrically connected the second contact of either the first or second native transistor with which it is associated.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
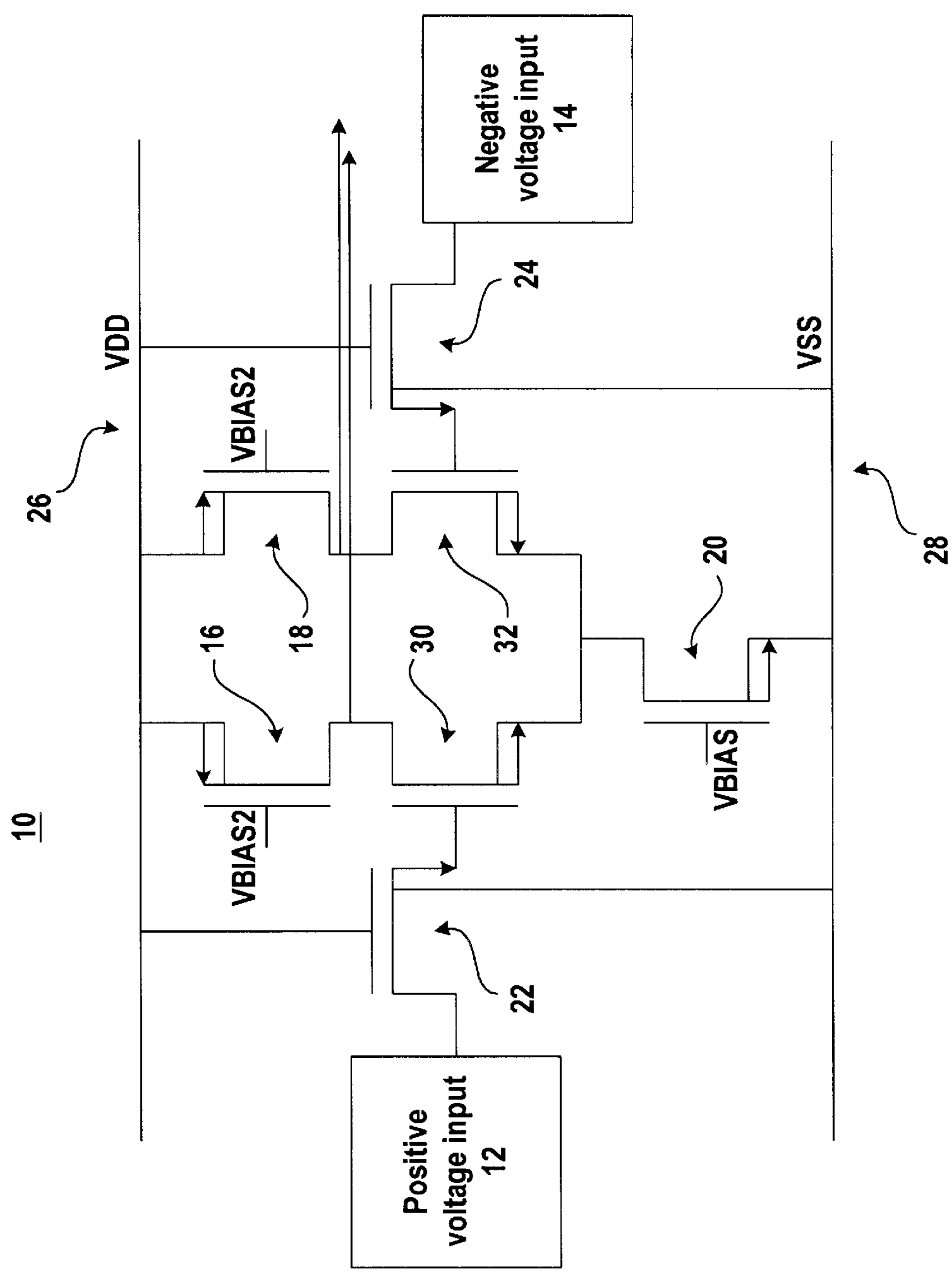
FIG. 1 is a circuit diagram of an input buffer according to the present invention.

With reference to FIG. 1 there is depicted a preferred embodiment of an input buffer 10 according to the invention. The buffer 10 has dual pull up PMOS transistors 16 and 18 that are connected to VDD line 26, and a pull down NMOS transistor 20 connected to VSS line 28. Between the pull up transistors 16 and 18 and the pull down transistor 20 there are two NMOS transistors 30 and 32. The gates of the NMOS transistors 30 and 32 are typically directly connected to the positive input voltage pad 12 and the negative input voltage pad 14 respectively. However, as mentioned above, with the buffer 10 directly connected to the voltage source pads 12 and 14 in such a manner, the buffer 10 is highly susceptible to failure from voltage spikes.

Therefore, in the preferred embodiment there is a native NMOS transistor 22 placed between the positive input voltage pad 12 and the gate of the NMOS transistor 30. Additionally, there is also placed a native NMOS transistor 24 between the negative input voltage pad 14 and the gate of the NMOS transistor 32. As described in more detail below, the native NMOS transistors 22 and 24 provide adequate overvoltage protection to the other elements of the buffer 10, without unduly reducing the sensitivity of the buffer 10 or the speed at which signals are propagated through the buffer 10, thereby allowing the buffer 10 to be used in high speed systems.

Figure 2B:
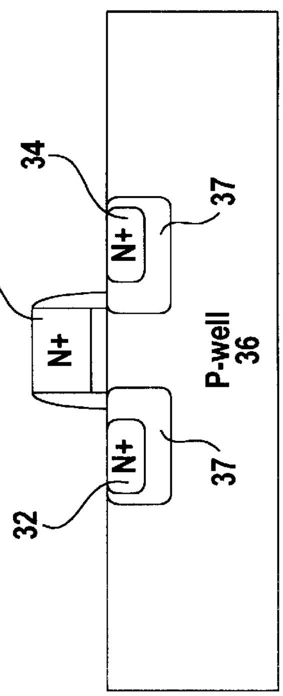
FIG. 2*b* is a cross sectional diagram of a second embodiment of a native NMOS transistor.
Figure 2A:
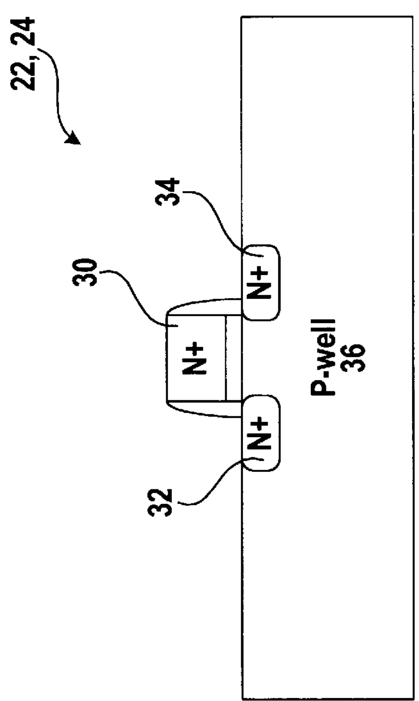
FIG. 2*a* is a cross sectional diagram of a first embodiment of a native NMOS transistor.

The native NMOS transistors 22 and 24 are preferably constructed as depicted in FIG. 2*a*. As depicted, the native NMOS transistors 22 and 24 each have a gate 30, source 32, and drain 34 that are all N+ doped. The well 36 of each of the native NMOS transistors 22 and 24 is P doped, but at a much lower dosage than that which is used for a standard NMOS device. Thus, the construction of the native NMOS transistors 22 and 24 is somewhat different from that of a standard transistor, which typically has a well with a standard level of doping.

FIG. 2*b* depicts an alternate embodiment of the native NMOS transistors 22 and 24, where N-wells 37 are formed as extensions of the source 32 and the drain 34. It is noted that these N-well areas 37 do not extend completely through the channel region. Rather, the channel is still formed of the very lightly doped P-well region 36. This embodiment of the native NMOS transistors 22 and 24 is preferably used when additional drain voltage tolerance is desirable.

Because of the unique construction of the native NMOS transistors 22 and 24, they tend to exhibit both a threshold voltage and a back bias coefficient of threshold voltage that are very low as compared to a standard MOS transistor, such as any one of 16, 18, 20, 30, and 32. Thus, the native NMOS transistors 22 and 24 preferably pass voltages all the way to the value of VDD, whereas a standard MOS transistor tends to pass a voltage that is limited to its bias voltage minus its voltage threshold. Therefore, the native NMOS transistors 22 and 24 provide for overvoltage protection to the buffer 10, but do not impede the sensitivity of the buffer 10, or unduly slow the operation of the buffer 10.

It is appreciated that the devices as depicted and described herein, whether designated as either NMOS or PMOS, are not necessarily limited to the dopant type as exemplified. In alternate embodiments, different dopant types can be used for the various transistors. It is also appreciated that the native NMOS transistors 22 and 24 can be used with other buffer 10 designs than that as specifically exemplified in the figures.

The voltage tolerance of the buffer 10 may be further improved by adjusting the drain doping of the native NMOS transistors 22 and 24 to drop the drain voltage across the drain depletion region, making the native NMOS transistors 22 and 24 even more drain voltage tolerant. This drain doping adjustment can be made either in process or in layout of the native NMOS transistors 22 and 24. In this manner, the native NMOS transistors 22 and 24 can be made to be tolerant to a drain voltage that is greater than that for which the gate oxide of the device has been designed for. For example, a device with a 3.3 volt gate oxide can be made to be tolerant of a 5.5 volt drain potential, or even a higher potential.

In other words, the gate oxide of a device may be designed to withstand a differential gate potential of only 3.3 volts, for example, when the other elements of the transistor are all at a common potential. This is referred to herein as a gate voltage or gate potential. However, the dopant profile of the drain can be modified so that if the differential potential is applied to the drain instead, and the other elements of the device are all at a common potential, then the device can withstand a differential potential that is in excess of 3.3 volts. This is referred to herein as a drain voltage or drain potential. The dopant profile may be preferably selected to withstand a nominal five volt or 5.5 volt differential drain potential, so as to be compatible with the voltage at which many other devices operate, and which may inadvertently be applied to the integrated circuit protected by the buffer 10.

Figure 3:
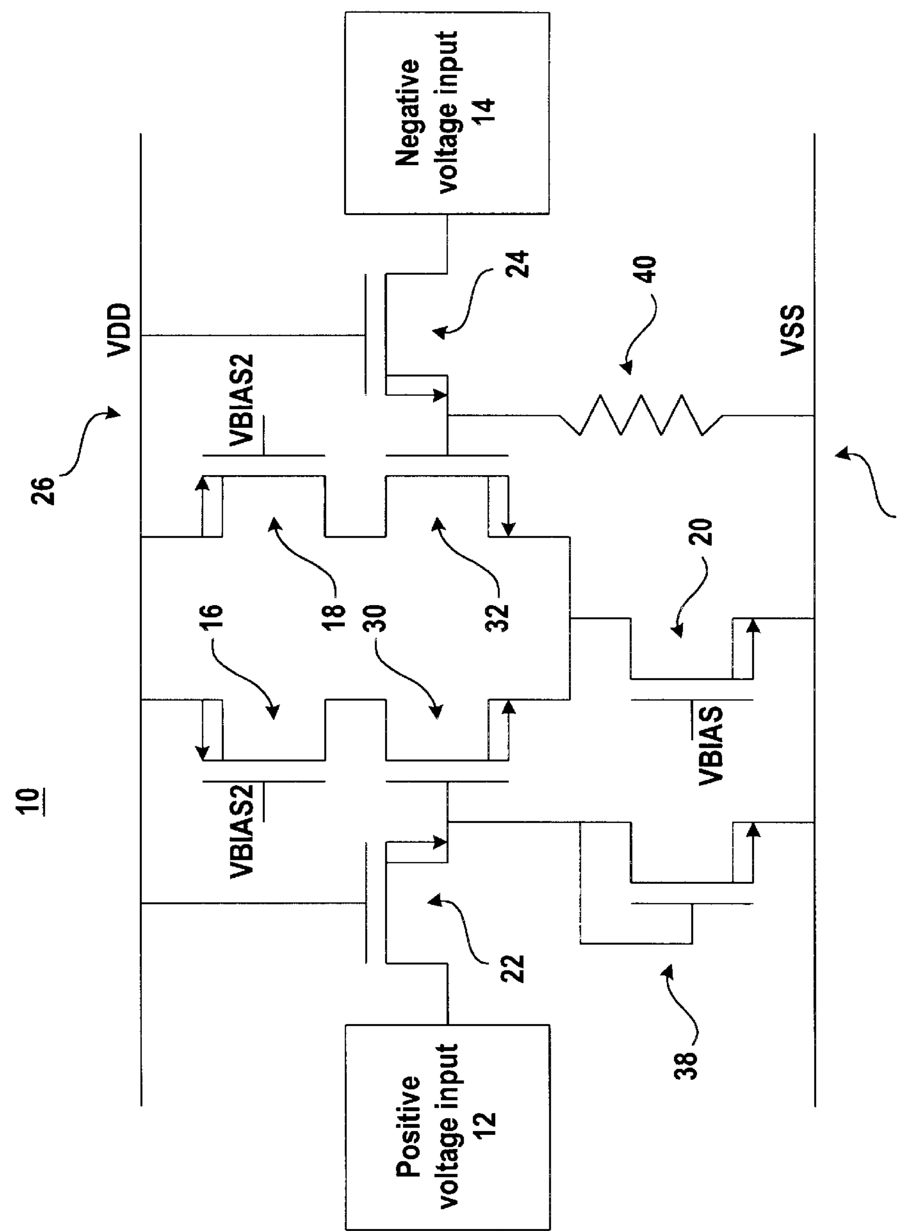
FIG. 3 is a circuit diagram of an alternate input buffer according to the present invention.

In an alternate embodiment of the invention, depicted in FIG. 3, there is shown a buffer 10 that includes leakage elements 38 and 40. The leakage elements 38 and 40 preferably limit the peak input voltage in a more accurate manner, by shunting off a portion of an overvoltage signal to the VSS line 28. For example, the direct current voltage across the native NMOS transistor 22 will tend to climb all the way until the sub threshold leakage of the native NMOS transistor 22 equals the diode leakage on the node. This value may be highly variable, or difficult to determine. This situation may exist on either of the native NMOS transistors 22 and 24. The leakage element 38 and 40 provide for additional protection in such a situation. As depicted in FIG. 3, the leakage elements 38 and 40 may be structures such as the NMOS transistor depicted as element 38 or the resistor depicted as element 40. In a preferred version of this embodiment, the leakage elements 38 and 40 have leakage currents of about one microampere.

Figure 4:
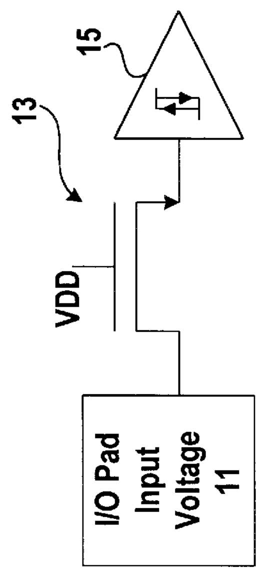
FIG. 4 is a circuit diagram of a buffer for a single ended input according to the present invention.

FIG. 4 depicts a native device 13 that is used as a buffer for a single ended input 15. In this configuration, the native device 13 acts as a buffer to an input such as a Schmidt trigger input 15, as depicted. The native device 13 may be configured either with or without a leaker 38 or 40, such as depicted in FIG. 3.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a high speed input buffer of the type having a first standard pull up transistor, a second standard pull up transistor, a first standard transistor, a second standard transistor, a standard pull down transistor, a first connection on a gate of the first standard transistor and none of the first standard pull up transistor, second standard pull up transistor, and standard pull down transistor in electrical communication with a positive voltage source, and a second connection on a gate of the second standard transistor and none of the first standard pull up transistor, second standard pull up transistor, and standard pull down transistor in electrical communication with a negative voltage source, the improvement comprising a first native transistor functionally disposed between the positive voltage source and the first connection, with a first contact of the first native transistor electrically connected to the positive voltage source and a second contact of the first native transistor electrically connected to the first connection, and a second native transistor functionally disposed between the negative voltage source and the second connection, with a first contact of the second native transistor electrically connected to the negative voltage source and a second contact of the second native transistor electrically connected to the second connection.

2. The high speed input buffer of claim 1 wherein the first native transistor comprises a native NMOS transistor.

3. The high speed input buffer of claim 1 wherein the second native transistor comprises a native NMOS transistor.

4. The high speed input buffer of claim 1 further comprising at least one leakage element having a first electrical connection and a second electrical connection, the first electrical connection of the at least one leakage element respectively electrically connected to at least one of the second contact of the first native transistor and the second contact of the second native transistor, and the second electrical connection of the at least one leakage element respectively electrically connected to a VSS line.

5. The high speed input buffer of claim 4 wherein the at least one leakage element comprises an NMOS transistor, where a gate contact of the NMOS transistor is also electrically connected to at least one of the second contact of the first native transistor and the second contact of the second native transistor.

6. The high speed input buffer of claim 4 wherein the at least one leakage element comprises a resistor.

7. The high speed input buffer of claim 4 wherein the at least one leakage element has a leakage current of about one microampere.

8. The high speed input buffer of claim 1 wherein the first native transistor has a drain dopant profile that tolerates a drain voltage that is greater than a gate voltage for which the first native transistor is designed to tolerate.

9. The high speed input buffer of claim 8 wherein the drain voltage is about five volts and the gate voltage is about 3.3 volts.

10. The high speed input buffer of claim 1 wherein the second native transistor has a drain dopant profile that tolerates a drain voltage that is greater than a gate voltage for which the second native transistor is designed to tolerate.

11. The high speed input buffer of claim 10 wherein the drain voltage is about five volts and the gate voltage is about 3.3 volts.

12. An integrated circuit including a high speed input buffer of the type having a first standard pull up transistor, a second standard pull up transistor, a first standard transistor, a second standard transistor, a standard pull down transistor, a first connection on a gate of the first standard transistor and none of the first standard pull up transistor, second standard pull up transistor, and standard pull down transistor in electrical communication with a positive voltage source and a second connection on a gate of the second standard transistor and none of the first standard pull up transistor, second standard pull up transistor, and standard pull down transistor in electrical communication with a negative voltage source, the improvement comprising a first native transistor functionally disposed between the positive voltage source and the first connection, with a first contact of the first native transistor electrically connected to the positive voltage source and a second contact of the first native transistor electrically connected to the first connection, and a second native transistor functionally disposed between the negative voltage source and the second connection, with a first contact of the second native transistor electrically connected to the negative voltage source and a second contact of the second native transistor electrically connected to the second connection.

* * * * *